United States Patent [19]

Schochet

[11] 4,100,560
[45] Jul. 11, 1978

[54] MULTI-PURPOSE MODIFICATION FOR LITHOGRAPHIC PLATE-MAKER

[76] Inventor: Frank E. Schochet, 4820 Highway 7, Minneapolis, Minn. 55416

[21] Appl. No.: 679,511

[22] Filed: Apr. 22, 1976

[51] Int. Cl.² .................... G03D 17/00; G03D 13/02
[52] U.S. Cl. .................................... 354/307; 354/333
[58] Field of Search ............... 354/297, 299, 307, 308, 354/309, 315, 316, 331, 333, 334, 335, 336, 337, 319, 320, 321, 322

[56] References Cited

U.S. PATENT DOCUMENTS

| | | | |
|---|---|---|---|
| 35,308 | 5/1862 | English | 354/308 |
| 728,538 | 5/1903 | Brown | 354/308 |
| 929,757 | 8/1909 | Ellis | 354/321 X |
| 1,358,622 | 11/1920 | D'Albert | 354/308 |
| 1,768,501 | 6/1930 | Beidler | 354/297 |
| 2,219,620 | 10/1940 | Brunk | 354/321 |
| 2,412,317 | 12/1946 | Campbell | 354/299 |
| 3,208,335 | 9/1965 | Doherty | 354/308 X |
| 3,314,352 | 4/1967 | Grant | 354/308 |
| 3,722,394 | 3/1973 | Sebastian | 354/331 X |
| 3,785,269 | 1/1974 | Morioka | 354/322 |

FOREIGN PATENT DOCUMENTS 945,367  7/1956  Fed. Rep. of Germany ....... 354/331

*Primary Examiner*—Fred L. Braun
*Attorney, Agent, or Firm*—Merchant, Gould, Smith, Edell, Welter & Schmidt

[57] ABSTRACT

An accessory for a photolithographic plate making machine including a developer tray positioned to divert a light sensitive medium from passage into the usual processor of the machine, a fixing tank to be substituted for the print catcher of the machine, and a timing hood for completing the light shielding of the developer tray and affording manual access to the tray and the tank. The hood further includes an indicator especially convenient for timing two events which are to occur in succession.

1 Claim, 8 Drawing Figures

MULTI-PURPOSE MODIFICATION FOR LITHOGRAPHIC PLATE-MAKER

BACKGROUND OF THE INVENTION

This invention relates to the field of photographic reproduction, and specifically comprises an inexpensive accessory for extending the usefulness of a known photolithographic plate making machine inexpensively so that it can do the work of a second expensive machine.

The principal work of a photolithography establishment is producing multiple copies of original sheets containing "line" material, that is, typescripts, charts, diagrams, and line drawings. For this purpose, a light sensitive photolithographic medium is used comprising firm paper coated with a complex emulsion such that after exposure and developing the portions of the medium, hereafter called a "plate," which are black in the original, have an affinity for ink, while the remainder of the plate does not. The plate may now be used for offset printing in the usual fashion, to make as many copies as are desired.

Equipment is known for making exposure on such medium and automatically developing the resulting plates. The medium, the appropriate activating and fixing chemicals, and the processing times and temperatures are all familiar. Reference is made to Fairbanks U.S. Pat. No. 3,283,647 for a teaching in this area.

There is, however, a significant demand in such establishments for copies of material which is not susceptible of treatment as described above. Photographs, three dimensional objects, and generally any material where shades of gray must be reproduced, do not give plates, using the medium and processing described above, which can be used satisfactorily for offset printing. A different light sensitive medium must be used, and the copying must be done through a half-tone screen to give an intermediate copy known as a "screen print," which itself can subsequently be copied by the basic process first described to give a satisfactory plate. The medium and processing chemicals and procedures are again known, as are machines for doing this work automatically, but the cost of such machines is so great that unless the purchaser can use the machine a high percentage of his daily working hours, it is not economically feasible.

SUMMARY OF THE INVENTION

My invention comprises an accessory for a common photolithographic machine which is simple and inexpensive: by its use, the machine may be quickly modified, to permit its use to make a small number of screen prints, and then restored to its normal state, the screen prints being subsequently copied to give plates for offset printing.

The accessory comprises three main components, a developer tray with a two-part, partial cover, a fixer tank, and a timer hood. The developer tray replaces portions of a processor in the normal machine, and diverts the exposed light sensitive medium from passing into the normal processing chemicals. The fixer tank replaces a print catcher in the normal machine, and may do so permanently. The hood completes the light shielding of the developer tray and affords manual access by the user to the tray and the tank. It includes a convenient small electrical distribution panel and a novel timer by which performance of the processing may be monitored and controlled.

Various advantages and features of novelty which characterize my invention are pointed out with particularity in the claims annexed hereto and forming a part hereof. However, for a better understanding of the invention, its advantages, and objects attained by its use, reference should be had to the drawing which forms a further part hereof, and to the accompanying descriptive matter, in which there is illustrated and described a preferred embodiment of the invention.

DESCRIPTION OF THE PREFERRED EMBODIMENT

Figure 1:
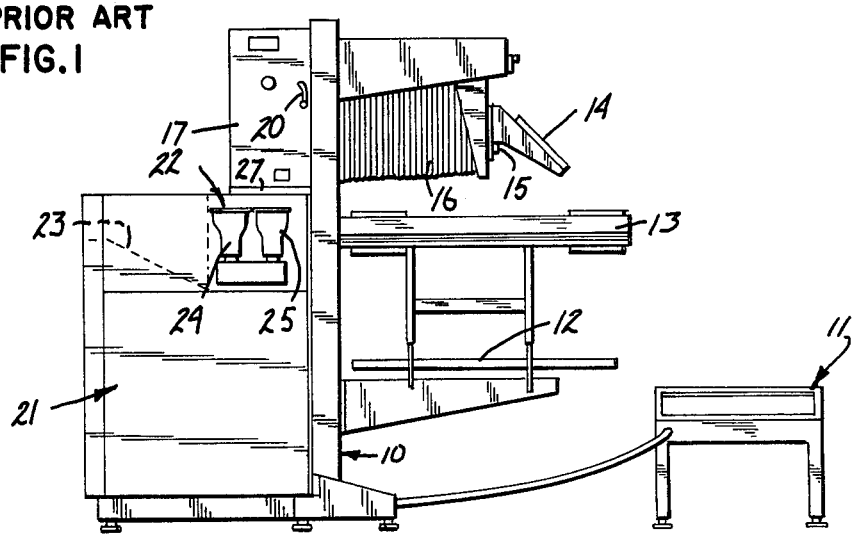
FIG. 1 is a side view.

As shown in FIG. 1, a photolithographic machine to which my invention is an accessory comprises a main frame 10 and a control console 11. A copy board 12 with lamps 13 is vertically adjustable along frame 10 with respect to optical equipment, including a mirror 14, a lens 15 having a shutter, not shown, and a bellows 16 providing focusing movement of the lens. Pivoted about a vertical axis to frame 10 is a magazine 17 including a latch 20. Within magazine 17 are a spool holder for photographic medium, suitable means for positioning the medium at a focal point for exposure, and means actuable to dispense the exposed medium from the magazine and cut it off. Below magazine 17 is a housing 21 including a processor 22 into which the exposed medium is fed from magazine 17 and from which the processed medium is discharged to a print catcher 23. Supply bottles 24 and 25 are provided for fixer and developer chemicals used in processor 22. Magazine 17 carries at its lower end a light seal 27 to prevent passage of actinic light into processor 22. The top and back of housing 21 are partially open centrally to give access to print catcher 23.

Figure 2:
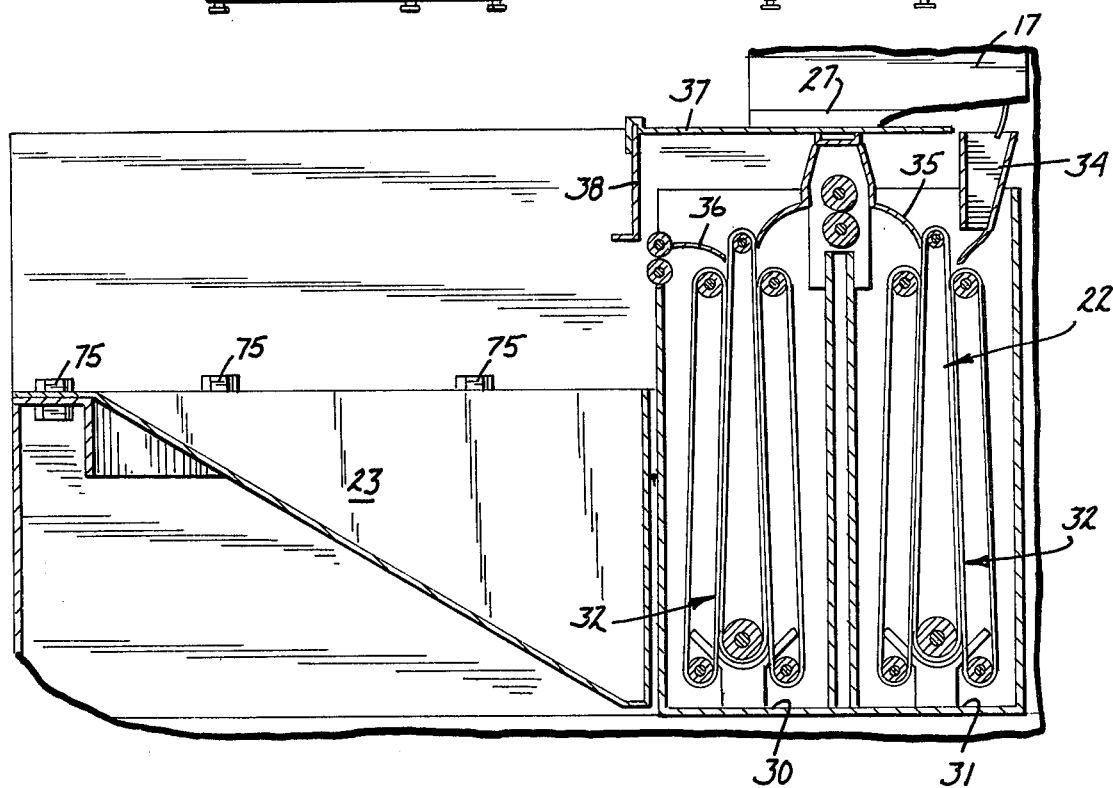
FIG. 2 is a view in central longitudinal vertical section of a prior art photolithographic machine with which my accessory is adapted to be used.

As shown in FIG. 2, processor 22 comprises a pair of tanks 30 and 31 each associated with means 32 such as a roller frame for feeding the medium down into and up out of the chemical liquid, together with means 34, 35 and 36 directing the medium from the magazine to the first tank, from one tank to another, and from the second tank to the print catcher, respectively. The first two of these latter three are removably positioned in a space over the tanks and the roller frames: the showing in FIG. 2 is schematic only. Housing 21 may include a splash plate 37 and a light shield 38.

The modifications of the above machine required for use of my accessory are minimal and reversible. Included are the temporary removal of elements 34, 35 and 38, and the temporary or permanent replacement of print catcher 23. In magazine 17 the appropriate substitution of photographic media must of course be accomplished, as well as the insertion of a suitable half-tone screen.

Figure 3:
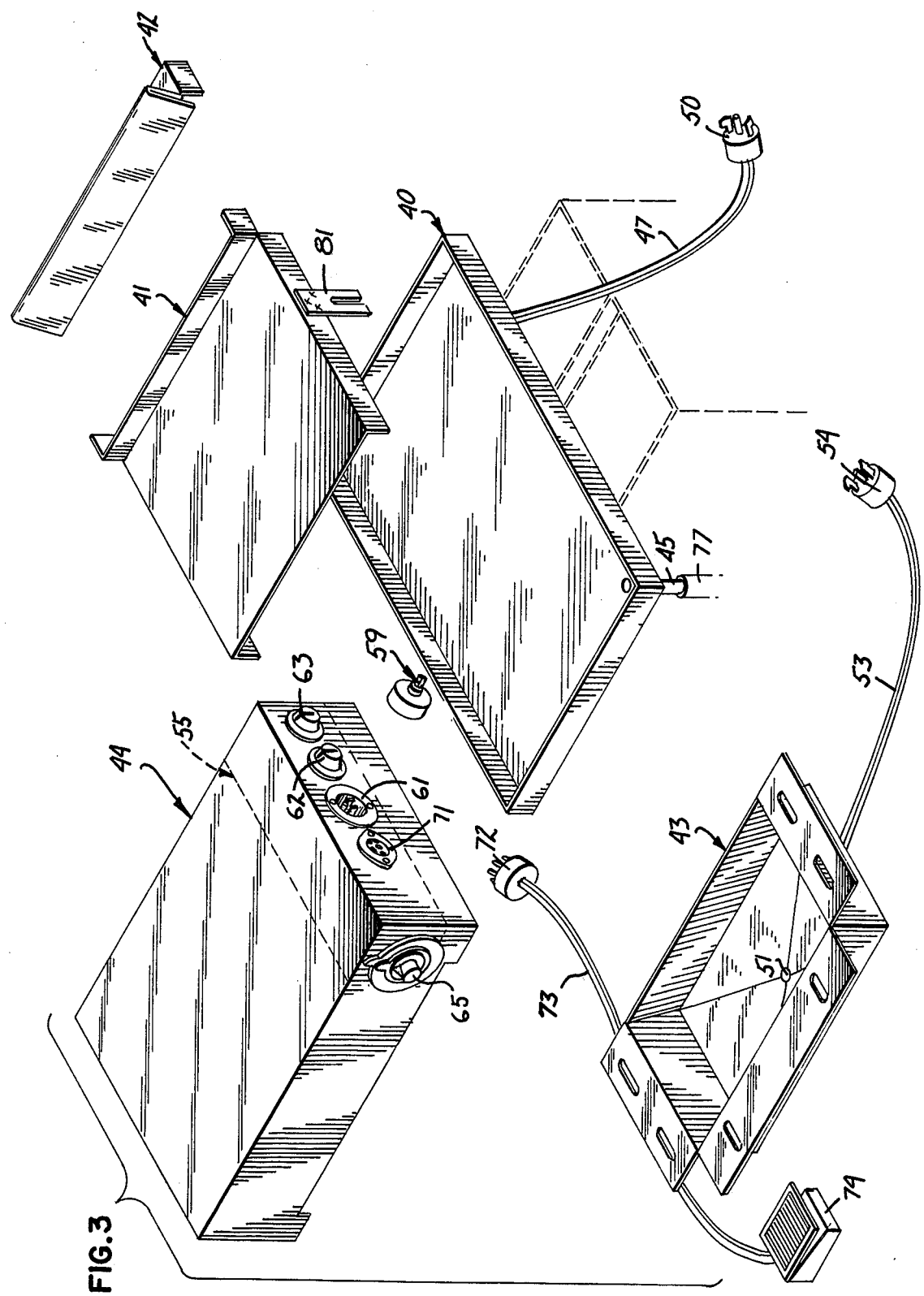
FIG. 3 shows the components making up my accessory.
Figure 4:
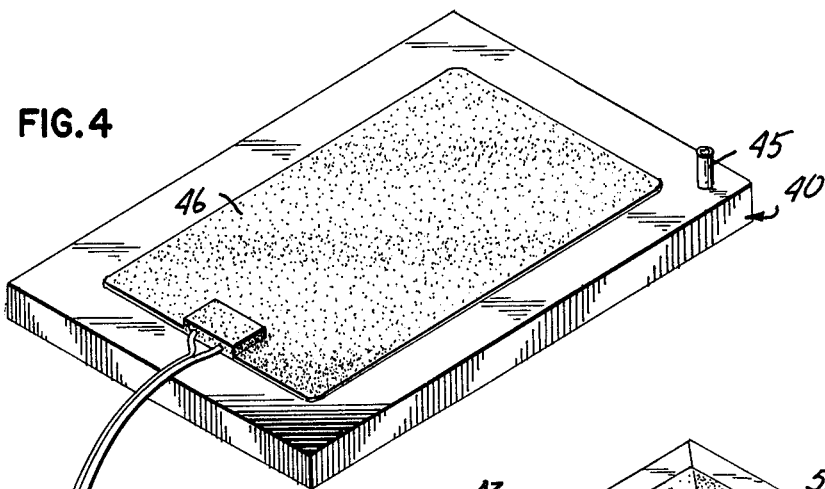
FIGS. 4, 5 and 6 are bottom views of those components.
Figure 5:
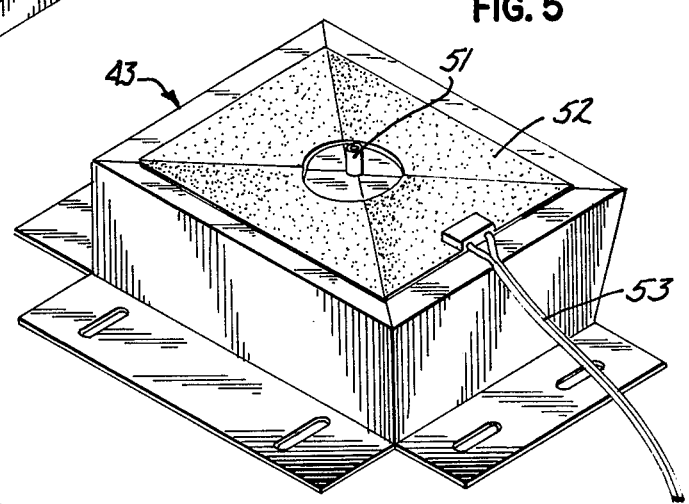
Figure 7:
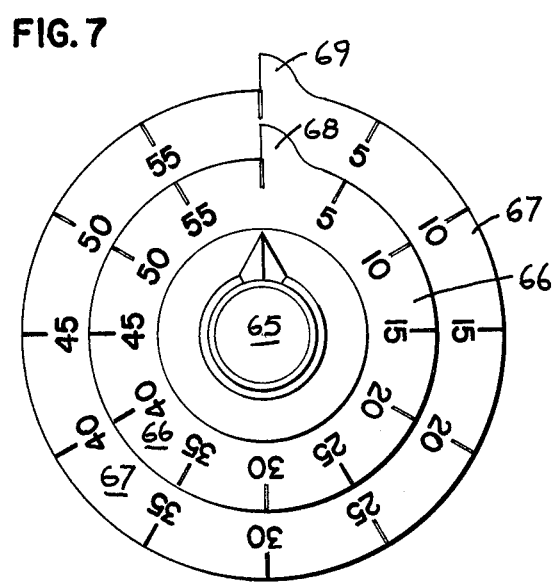
FIG. 7 is a detail of a timer used in my accessory, to a larger scale.

Turning now to FIG. 3, the components making up my accessory are first container means in the form of a developer tray 40 having a cover in two portions 41 and 42, second container means in the form of a fixer tank 43, and a timer hood 44. Tray 40 includes a drain connection 45 at one corner, and has secured to the outer surface of its bottom an electric heater 46 with an energizing cord 47 having a connection plug 50, as shown in FIG. 4. Tank 43 has a central drain connection 51 and has secured to the outer surface of its bottom an electric heater 52 with an energizer cord 53 having a connection plug 54.

One end of timer hood 44 contains a closed subchassis 55 including a bottom panel 56 fitted with two outlets 57, 60 for receiving plugs 50, 54. Electrical energy for heaters 46 and 52 may be supplied to subchassis 55 through a cable 59 to a connector 61, heat adjusting rheostats 62 and 63 being also provided. Also contained in subchassis 55 is a timer including a 1 rpm timer motor 64 having a shaft projecting outward of timer hood 44 and carrying an index 65. A pair of manually rotatable scales 66 and 67 having angularly identical graduations are mounted concentrically with the shaft of index 65, and are provided with manual actuating tabs 68 and 69 aligned with their zero graduations.

Electrical energy from connector 61 is supplied to timer motor 64 under control exerted through a connector 71, a plug 72 and a cable 73 by a foot switch 74, as will be described below.

Figure 8:
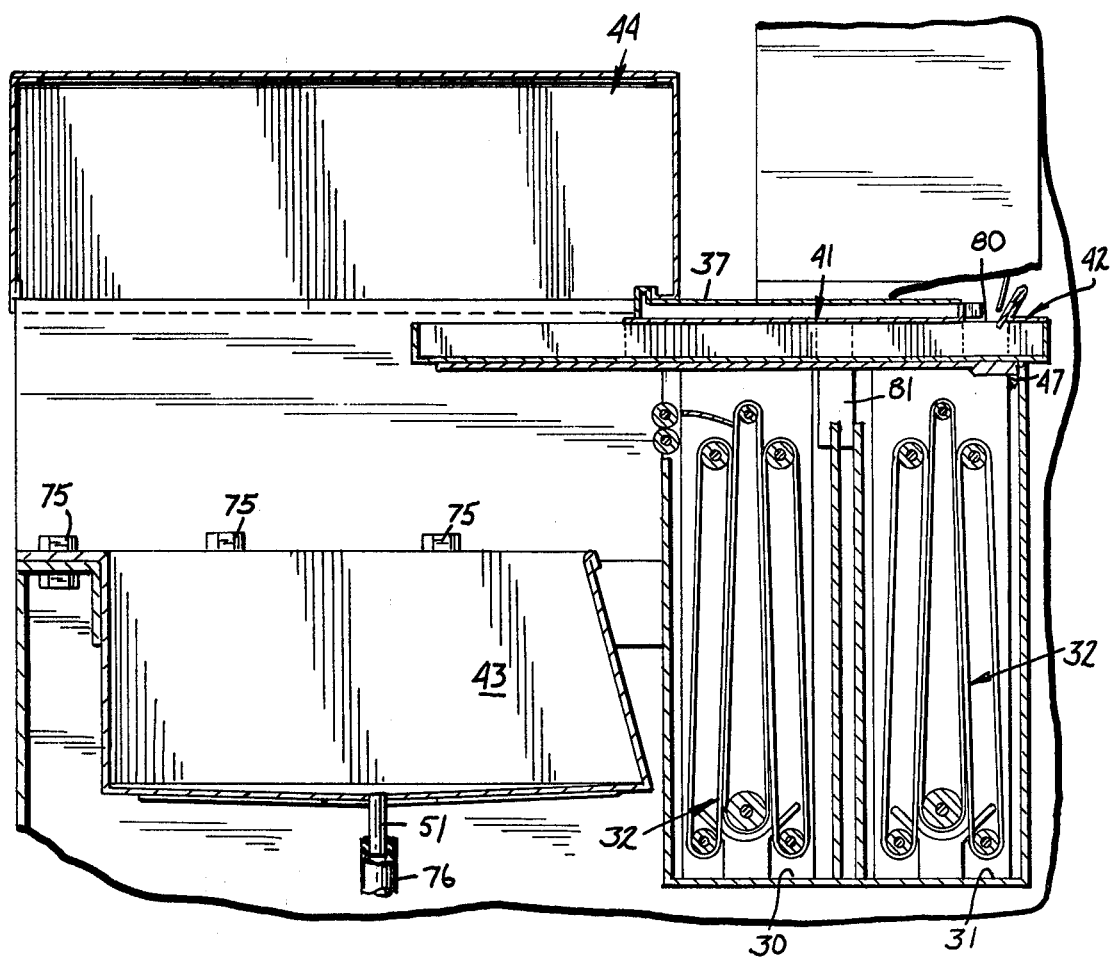
FIG. 8 shows my accessory installed.
Figure 6:
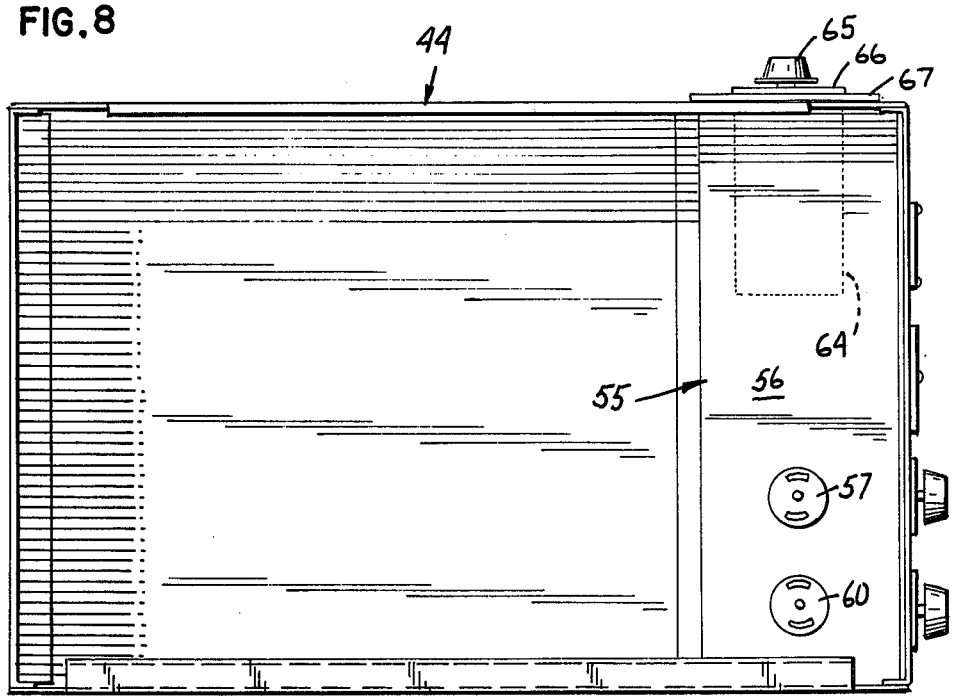

The various components of my accessory having been identified and described, the method of inserting them into the photolithographic machine will now be explained with the help of FIGS. 2 and 8.

Magazine 17 is first opened (darkroom conditions are not necessary) and the roll of "plate" material therein is removed and stored. Splash plate 37 and light shield 38 are removed, to permit the removal of members 34 and 35, which will not be needed during use of the accessory. Print catcher 23 is also removed, by loosening fasteners 75, and fixer tank 43 is substituted, a suitable drain connection 76 including shut-off means such as a pinch clamp being included. Developer tray 40 is now positioned on top of processor 22, its height being such as to fit in the available space. A suitable drain connection 77 including a shut-off means is included here as well. Cover portions 41 and 42 are placed on tray 40 and positioned to leave a proper aperture 80 for passage of dispensed photographic material into tray 40: cover portion 41 has a pair of slotted tabs 81 arranged for engagement with a wall of tank 30 to hold everything in place. The appropriate amounts of the intended chemical solutions are added to tray 40 and tank 43, and splash plate 37 is reinstalled. Screen print medium and a half-tone screen are inserted in magazine 17 which is closed and latched. Plugs 50 and 54 are inserted into sockets 57 and 60, hood 44 is placed on housing 22, and foot switch 74 is connected thereto. It will be apparent that manual access is available from the rear of the machine, that is, from the left of FIG. 8, downwardly into fixer tank 43 and upwardly into developer tank 40, the space under most of hood 44 being of use for the latter purpose. Electric power is supplied to hood 44 at inlet 61. Console 11 may be moved to a point convenient to the rear of the machine.

Operation

In use, a photograph, physical unit, or other subject is placed on copy board 12 and the board and lens positions are adjusted as necessary to give the desired size of screen print. The zero of scale 67 is set in alignment with index 65, and the zero of scale 66 is set at the graduation on scale 67 representing the desired developing interval. When this has been accomplished, a start button on console 73 is operated to start a cycle of machine operation. The lens shutter operates. When the appropriate exposure has been made, the medium is then fed downward through aperture 80, being diverted by developer tray 40 from normal passage through processor 22, which thus operates without effect. The exposed screen print is cut off and drops into developer tray 40. Foot switch 74 is operated to start timer motor 64. By use of a stirring rod the operator agitates the developer fluid above the screen print, at the same time monitoring the position of index 65 with respect to scales 67 and 66: when index 65 reaches the location of zero on scale 66, the operator deenergizes the foot switch and transfers the screen print manually from tray 40 to tank 43: he then reenergizes the foot switch until index 65 indicates the desired fixing interval on scale 66, at which time the screen print is removed from tank 43 and the operator deenergizes the foot switch. Scales 67 and 66 are then reset to index 65, with the tab on scale 67 at zero at index 65 and the tab on scale 66 at the point on scale 67 which conforms with the developing time desired.

When the number of screen prints needed has been prepared, tray 40 and tank 43 may be drained and rinsed, and the former may be removed to allow replacement of members 34 and 35, accompanied by substitution of light sensitive plate media and removal of the half-tone screen in magazine 17. Tank 43 may be left in the machine to perform the function of print catcher 23: if its depth makes its use inconvenient, a simple cardboard lid may be laid across it. Hood 44, splash plate 37 and light shield 38 are replaced.

From the foregoing, it will be evident that I have invented a new and inexpensive method and accessory for use with a photolithographic plate making machine to facilitate the preparation of copies of material having gray tones. The changes needed in the machine itself are minimal and reversible, and may be accomplished quickly and easily. Included is a new and convenient indicator for use by the operator in performing the manual processing of the work product. The cost of the accessory is a small fraction of the cost of a full machine for doing the same work.

Numerous characteristics and advantages of my invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

What is claimed is:

1. In an automatic photolithographic machine in which an exposed photolithographic medium is normally transferred automatically from a magazine through an actinically closed chamber including a succession of containers for activating and fixing solutions, to an actinicially unshielded manual access discharge location, the improvement which comprises:

first container means at least partially enclosed in said chamber and removably interposed between the magazine and the containers to prevent normal passage of the medium to said containers and to receive the medium in a first chemical bath in manually accessible fashion;

second container means removably positioned in said discharge location for receiving the medium in a second chemical bath when manually transferred from said first container means; and means mounted on said machine over said discharge location and the portion of said first container means not enclosed in said chamber, to prevent actinic light from reaching said first container means, while affording manual access to both said container means.

* * * * *